US007989948B2

(12) United States Patent
Hsieh et al.

(10) Patent No.: US 7,989,948 B2
(45) Date of Patent: Aug. 2, 2011

(54) CHIP PACKAGE STRUCTURE AND METHOD OF FABRICATING THE SAME

(75) Inventors: Jui-Ching Hsieh, Taichung (TW); Pin Chang, Hsinchu (TW); Chung-De Chen, Miaoli County (TW); Li-Chi Pan, Hsinchu (TW); Yu-Jen Wang, Taipei County (TW); Chin-Horng Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 74 days.

(21) Appl. No.: 12/472,359

(22) Filed: May 26, 2009

(65) Prior Publication Data
US 2010/0139767 A1    Jun. 10, 2010

(30) Foreign Application Priority Data
Dec. 5, 2008  (TW) .............................. 97147409 A (51) Int. Cl.
*H01L 21/50* (2006.01)
(52) U.S. Cl. .................. 257/712; 257/99; 257/E23.08
(58) Field of Classification Search .............. 257/99, 257/259, 712; 438/122, 26, 64
See application file for complete search history.

(56) References Cited

U.S. PATENT DOCUMENTS

| 4,321,310 | A | * | 3/1982 | Ulion et al. | 428/612 |
| 5,495,979 | A | * | 3/1996 | Sastri et al. | 228/124.1 |
| 5,598,036 | A | * | 1/1997 | Ho | 257/738 |
| 5,682,661 | A | * | 11/1997 | Hurner | 29/402.08 |
| 5,901,043 | A | | 5/1999 | Lin et al. | |
| 6,028,364 | A | * | 2/2000 | Ogino et al. | 257/778 |
| 6,509,529 | B2 | | 1/2003 | Kamath et al. | |

FOREIGN PATENT DOCUMENTS

| CN | 1542952 A | 11/2004 |
| CN | 1758431 A | 4/2006 |
| CN | 201146657 Y | 11/2008 |
| TW | 200703525 | 1/2007 |

OTHER PUBLICATIONS

"First Office Action of China Counterpart Application", issued on Feb. 24, 2011, p. 1-p. 8, in which the listed references were cited.

* cited by examiner

*Primary Examiner* — Roy K Potter
(74) *Attorney, Agent, or Firm* — Jianq Chyun IP Office (57) ABSTRACT

A chip package structure including a heat dissipation substrate, a chip and a heterojunction heat conduction buffer layer is provided. The chip is disposed on the heat dissipation substrate. The heterojunction heat conduction buffer layer is disposed between the heat dissipation substrate and the chip. The heterojunction heat conduction buffer layer includes a plurality of pillars perpendicular to the heat dissipation substrate. The aspect ratio of each pillar is between about 3:1 and 50:1.

13 Claims, 13 Drawing Sheets

CHIP PACKAGE STRUCTURE AND METHOD OF FABRICATING THE SAME

CROSS-REFERENCE TO RELATED APPLICATION

This application claims the priority benefit of Taiwan application serial no. 97147409, filed Dec. 5, 2008. The entirety of the above-mentioned patent application is hereby incorporated by reference herein and made a part of specification.

BACKGROUND OF THE INVENTION

1. Field of the Invention

The present invention relates to a chip package structure and method of fabricating thereof providing good heat dissipation and absorption of shear stress.

2. Description of Related Art

In consideration of and by requirement of energy conservation and development of new technology for non-polluting energy sources, renewable energy sources have become the focus of attention, especially solar cells. In general, a III-V solar cell chip usually has better photoelectric effect but also has a rather high cost. Therefore, a great area of concentration system is used in association with the III-V solar cell chip to increase the concentration ratio to over a thousand times or more. However, a first problem to be solved for such a system is heat dissipation. In addition, a high power light emitting diode (LED) chip is also one of the current and common concentrator photovoltaic cells but also has the same problem of poor heat dissipation.

During the packaging process, a chip is usually disposed on a substrate and heat conducting adhesive or solder bumps are often used as a bonding medium for the chip and the substrate. The heat conducting adhesive is usually resin having a low coefficient of thermal conductivity and poor heat dissipation. Although the bonding method using solder bumps is easy at fabrication and has a low cost, coefficients of thermal expansion of bonding surfaces differ. Fatigue effect resulted from repetitive changes in temperature during system operation is mainly the reason for damage to bonding points of the chip. Fatigue failure may be classified into mechanical fatigue failure and thermal fatigue failure. Mechanical fatigue failure is due to continuous transformation and movement, resulting in decrease in mechanical strength. Thermal fatigue failure, on the other hand, is caused by poor match of coefficients of thermal expansion between two surfaces, resulting in the two surfaces pulling each other because of minor transformation generated at high and low temperatures, which, under long term influences, may easily cause the surfaces to peel off. As such, the chip and the substrate under the chip are damaged and performance as well as reliability of the chip package structure thereby decreases. In addition, the chip may be bonded to a submount which has a close coefficient of thermal expansion to the coefficient of thermal expansion of the chip. However, a material of the submount is usually ceramic such as $Al_2O_3$ and AlN. The structure of high power chip package has to include the submount. Therefore, there exist problems such as a low coefficient of thermal conductivity and high costs.

SUMMARY OF THE INVENTION

The present invention discloses a chip package structure providing good heat dissipation, absorption of shear stress, and prevention of mechanical fatigue failure or thermal fatigue failure of the system due to temperature changes.

The present invention provides a fabricating method for a chip package structure using a micro-electroforming technology for fabricating the chip package structure, thereby increasing performance and reliability of the chip package.

The present invention provides a chip package structure including a heat dissipation substrate, a chip, and a heterojunction heat conduction buffer layer. The chip is disposed on the heat dissipation substrate. The heterojunction heat conduction buffer layer is disposed between the heat dissipation substrate and chip. The heterojunction heat conduction buffer layer includes a plurality of pillars perpendicular to the heat dissipation substrate. The aspect ratio of each pillar is between about 3:1 and 50:1.

The present invention further provides a method of fabricating a chip package structure. First, a heat dissipation substrate is provided. Next, the heterojunction heat conduction buffer layer is formed on the heat dissipation substrate and includes a plurality of pillars perpendicular to the heat dissipation substrate. Then, the chip is bonded onto the heterojunction heat conduction buffer layer.

In the chip package structure of the present invention, the heterojunction heat conduction buffer layer disposed between the chip and the heat dissipation substrate has good heat dissipation, may release shear stress, and thus can prevent mechanical fatigue failure or thermal fatigue failure of the system due to temperature changes, thereby increasing performance and reliability of the chip package structure.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
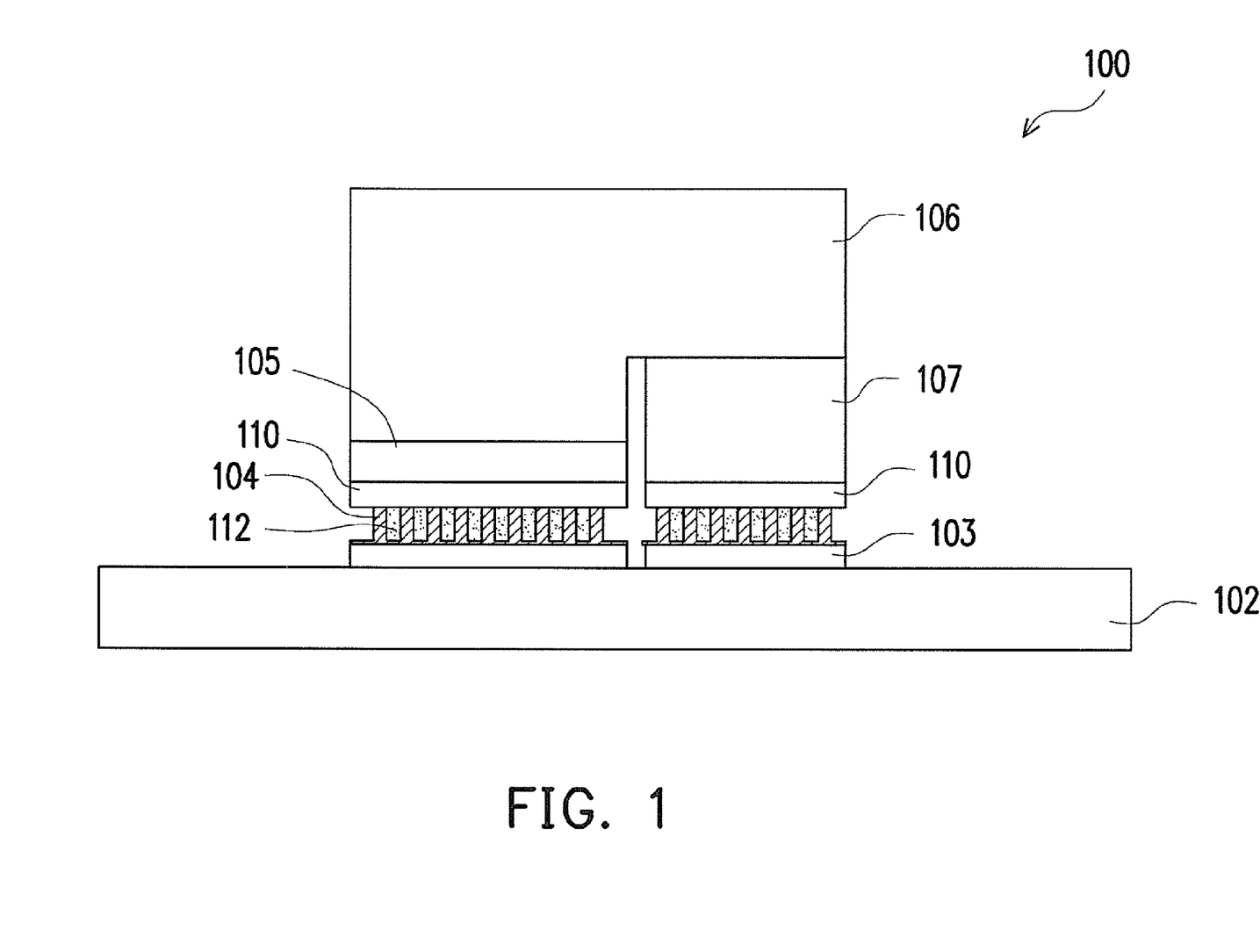
FIG. 1 is a schematic cross-sectional view of a chip package structure according to an embodiment of the present invention.
Figure 2A:
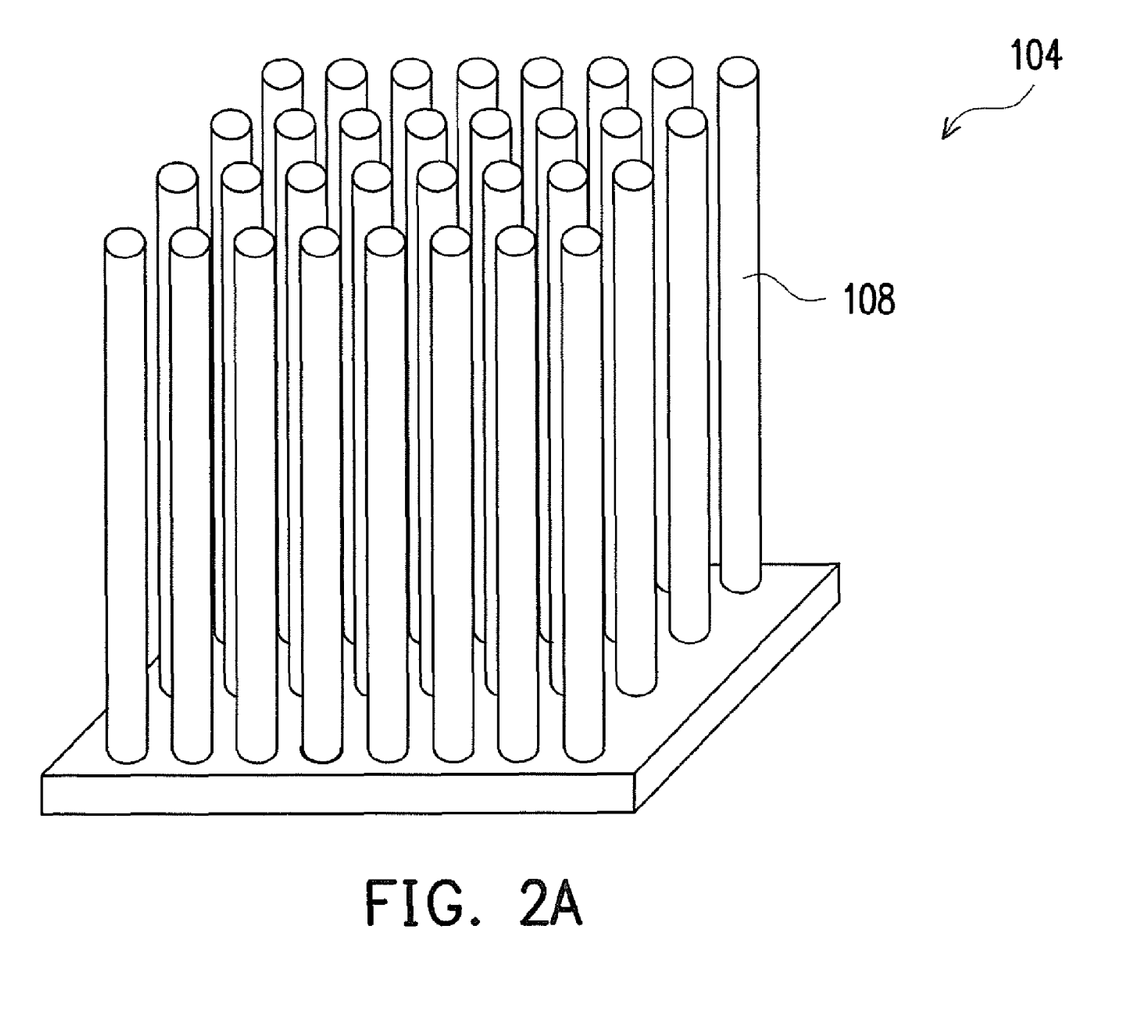
FIG. 2A is a perspective schematic view of the heterojunction heat conduction buffer layer in FIG. 1.
Figure 2B:
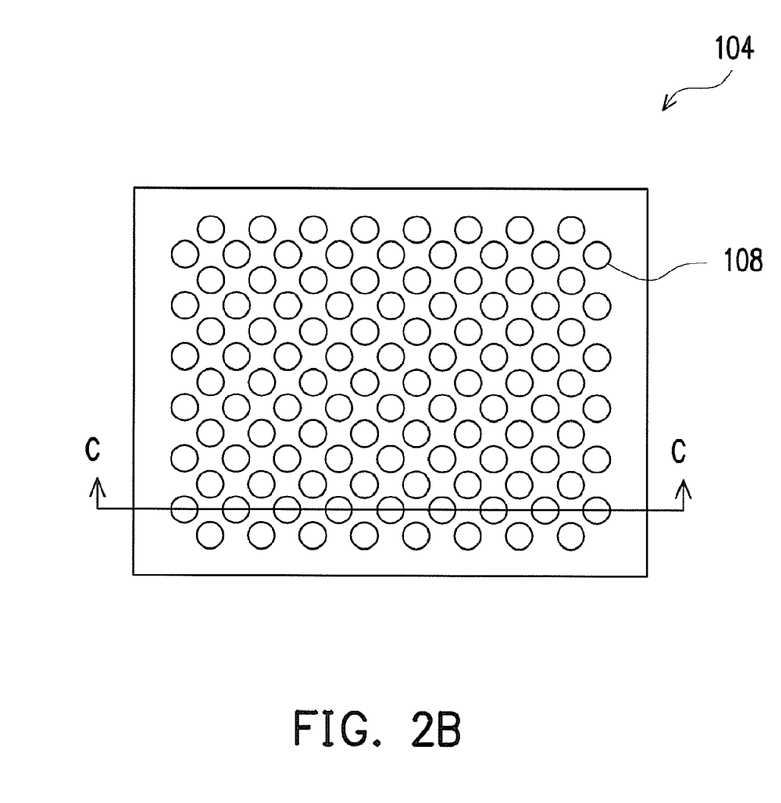
FIG. 2B is a top schematic view of the heterojunction heat conduction buffer layer in FIG. 1.
Figure 2C:
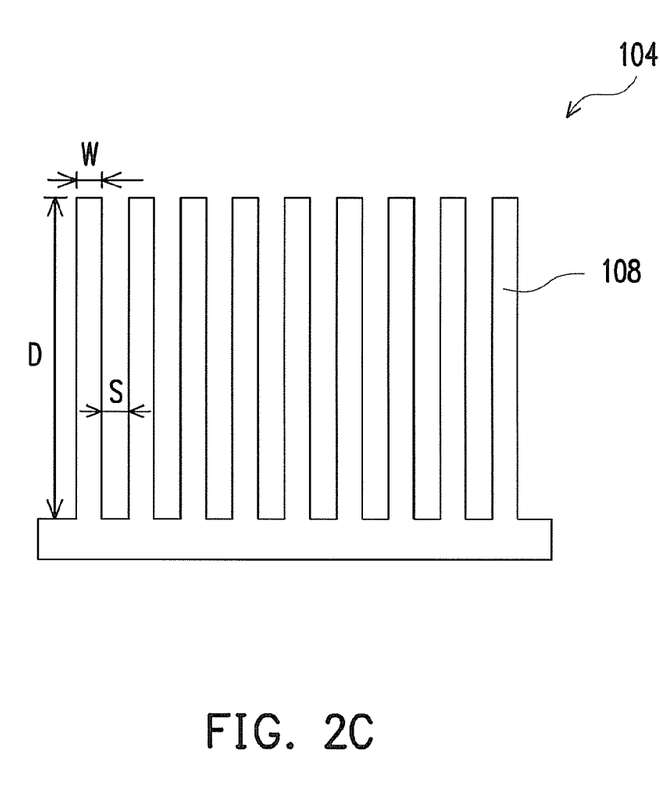
FIG. 2C is an enlarged cross-sectional schematic view of the heterojunction heat conduction buffer layer taken along the line C-C in FIG. 2B.

FIG. 1 is a schematic cross-sectional view of a chip package structure according to an embodiment of the present invention. FIG. 2A is a perspective schematic view of the heterojunction heat conduction buffer layer in FIG. 1. FIG. 2B is a top schematic view of the heterojunction heat conduction buffer layer in FIG. 1. FIG. 2C is an enlarged cross-sectional schematic view of the heterojunction heat conduction buffer layer taken along the line C-C in FIG. 2B.

Referring to FIG. 1, a chip package structure 100 includes a heat dissipation substrate 102, a heterojunction heat conduction buffer layer 104, and a chip 106. The heat dissipation substrate 102 is, for example, a metal core printed circuit board (MCPCB), of heat sink, or ceramic material. A material of the MCPCB is copper or aluminum, for example.

The chip 106 is disposed on the heat dissipation substrate 102. The chip 106 is an LED chip having a P-electrode 105 and an N-electrode 107, for example. The chip 106 may also be a solar cell chip or other concentrator photovoltaic cells.

The heterojunction heat conduction buffer layer 104 is disposed between the heat dissipation substrate 102 and chip 106. A material of the heterojunction heat conduction buffer layer 104 includes tin, copper, or other high heat conduction metal material. In one embodiment, for example, the heat dissipation substrate 102 has a plurality of bonding pads 103 disposed thereon and the heterojunction heat conduction buffer layer 104 is disposed on the bonding pads 103 of the heat dissipation substrate 102.

Next, referring to FIG. 1 and FIGS. 2A to 2C, a detailed illustration on the structure of the heterojunction heat conduction buffer layer 104 is given below. The heterojunction heat conduction buffer layer 104 includes a plurality of pillars 108 perpendicular to the heat dissipation substrate 102. Each pillar 108 has a depth D and a width W. A space S is between the pillars 108. An aspect ratio of each pillar 108 is between about 3:1 and 50:1. In one embodiment, D is 30 μm, W is 10 μm, and S is 10 μm. In another embodiment, D is 100 μm, W is 2 μm, and S is 2 μm. W and S may be the same or different.

In addition, a cross-section of the pillar 108 of the heterojunction heat conduction buffer layer 104 is circular, for example. The pillars 108 are arranged in array, for example, in a most compact regular triangular array, as shown in FIG. 2B. People of ordinary skill in the art of the present invention should certainly realize that the cross-section of the pillar 108 of the heterojunction heat conduction buffer layer 104 and the distribution of the array are not to be limited as shown in FIG. 2B and may be adjusted according to design requirement. In other words, the cross-section of the pillar 108 of the heterojunction heat conduction buffer layer 104 may be circular, rectangular, triangular, or diamond. The array arrangement of the pillars 108 of the heterojunction heat conduction buffer layer 104 may be regular or irregular. In one embodiment, when the heterojunction heat conduction buffer layer 104 is a square pillar, height of the heterojunction heat conduction buffer layer 104 is 1/5-1/10 of length or width thereof.

The chip package structure 100 of the present invention may also include a bonding layer 110 and a filler 112. The bonding layer 110 is disposed between the chip 106 and the heterojunction heat conduction buffer layer 104. Specifically, the bonding layer 110 is disposed on surfaces of the P-electrode 105 and the N-electrode 107. A material of the bonding layer 110 may be the same as or different from a material of the heterojunction heat conduction buffer layer 104. The material of the bonding layer 110 includes tin (Sn), copper, gold (Au), silver, or Au—Sn alloy, for example.

The filler 112 is disposed among the pillars 108 of the heterojunction heat conduction buffer layer 104. A material of the filler 112 includes polymer such as thermal grease and silver paste, or metallic powder such as non-metallic resin mixed with metallic powder.

In the chip package structure 100 of the present invention, the pillars 108 of the heterojunction heat conduction buffer layer 104 are arranged in high density to increase heat conduction area. Furthermore, the pillars 108 of the heterojunction heat conduction buffer layer 104 have a high aspect ratio and thus have flexibility to release the shear stress. In addition, the filler 112 disposed among the pillars 108 of the heterojunction heat conduction buffer layer 104 can further increase heat conduction. In other words, the chip package structure 100 of the present invention has good heat dissipation, may release shear stress, and thus can prevent mechanical fatigue failure or thermal fatigue failure of the system due to temperature changes, thereby increasing performance and reliability of the chip package structure 100.

Several embodiments are described below to illustrate the fabricating method of the chip package structure of the present invention.

The First Embodiment

FIGS. 3A to 3F are schematic cross-sectional views illustrating a flow of process for fabricating a chip package structure according to a first embodiment of the present invention.

Figure 3A:
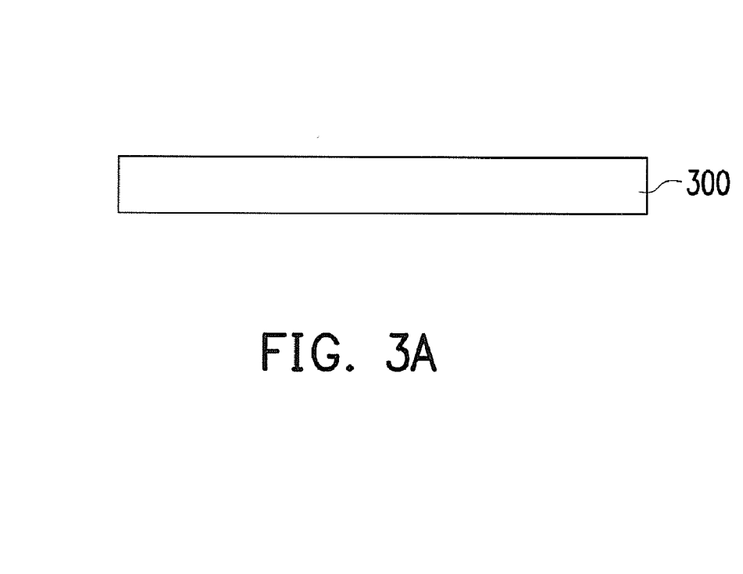
FIGS. 3A to 3F are schematic cross-sectional views illustrating a flow of process for fabricating a chip package structure according to a first embodiment of the present invention.

First, referring to FIG. 3A, a heat dissipation substrate 300 is provided. The heat dissipation substrate 300 is, for example, a metal core printed circuit board (MCPCB), of heat sink, or ceramic material. A material of the MCPCB is copper or aluminum, for example.

Figure 3B:
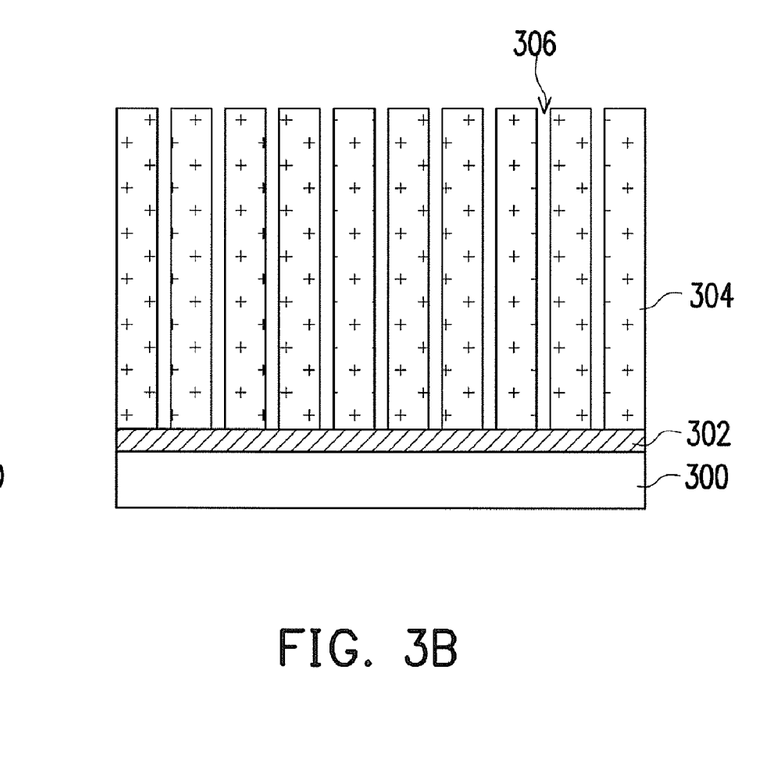
Figure 3C:
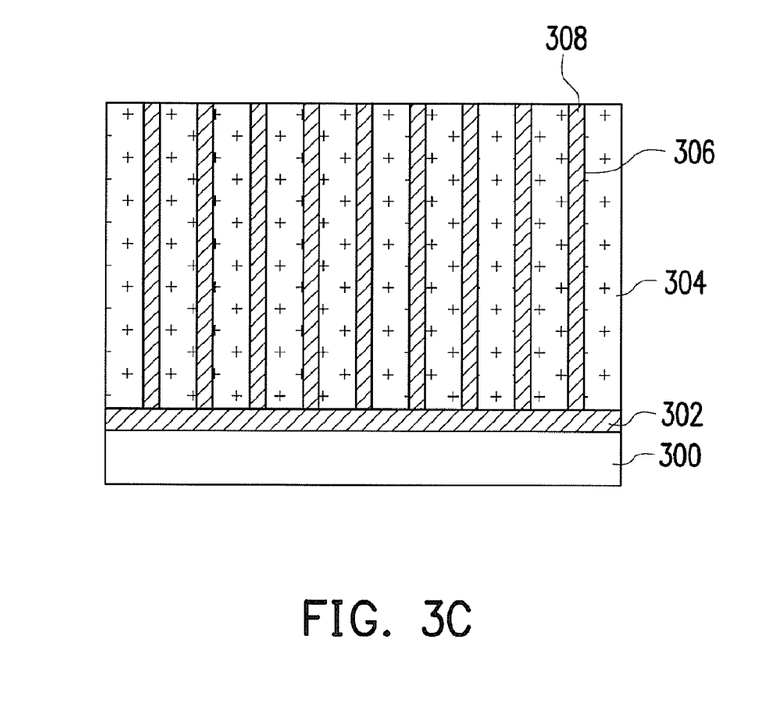
Figure 3D:
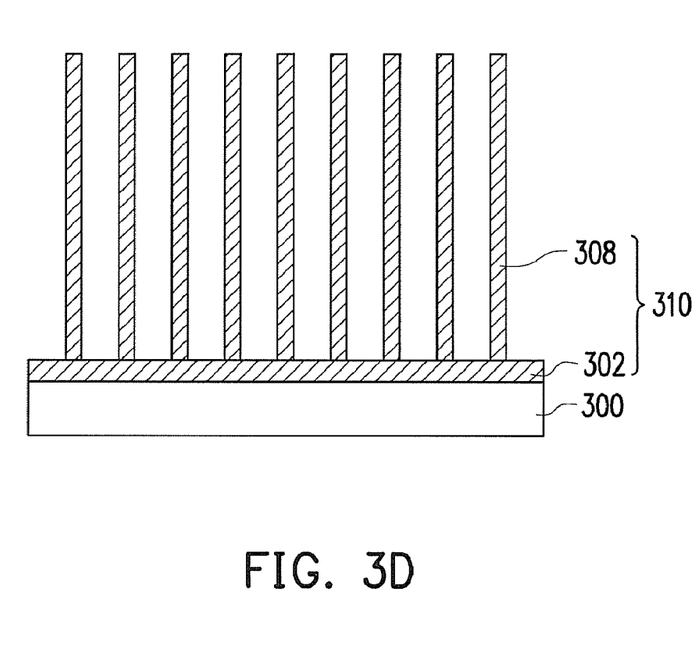

Next, the steps to form a heterojunction heat conduction buffer layer on the heat dissipation substrate 300 using a micro-electroforming technology are as shown in FIGS. 3B to 3D.

Referring to FIG. 3B, a metal seed layer 302 is formed on the heat dissipation substrate 300. A method of forming the metal seed layer 302 includes micro-electroforming, evaporation, or sputtering. Then, a photoresist layer 304 is formed on the metal seed layer 302. The photoresist layer 304 has a plurality of openings 306, each having an aspect ratio of about 3:1 to 50:1.

Next, referring to FIG. 3C, a first micro-electroforming process is performed on the metal seed layer 302 to form pillars 308 in the openings 306 of the photoresist layer 304.

Afterward, referring to FIG. 3D, the photoresist layer 304 is removed to form a heterojunction heat conduction buffer layer 310. In the present embodiment, the heterojunction heat conduction buffer layer 310 includes the metal seed layer 302 and the pillars 308.

Figure 3E:
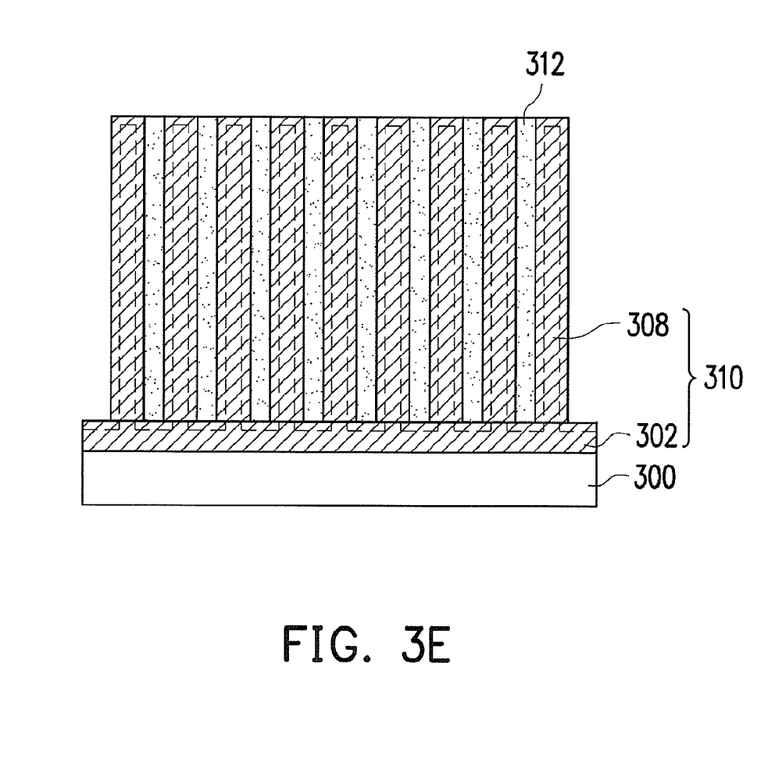

Subsequently, referring to FIG. 3E, a second micro-electroforming process is selectively performed on the heterojunction heat conduction buffer layer 310 to increase width of each pillar 308 of the heterojunction heat conduction buffer layer 310. In other words, the second micro-electroforming process is used to increase a filling factor, the aspect ratio of each pillar 308, and thickness of the metal seed layer 302. In the present embodiment, the aspect ratio of each opening 306 of the photoresist layer 304 is about 5:1. The aspect ratio of each pillar 308 after the first micro-electroforming process is maintained at about 5:1. However, after the second micro-electroforming process, the aspect ratio of each pillar 308 can be increased. Next, a filler 312 may be selectively formed among the pillars 308 of the heterojunction heat conduction buffer layer 310. A material of the filler 312 includes polymer such as thermal grease and silver paste, or metallic powder such as non-metallic resin mixed with metallic powder.

In addition to the abovementioned micro-electroforming technology, the heterojunction heat conduction buffer layer may also be formed using the currently developed nanotechnology to increase the aspect ratio of the pillars 308 thereby formed to about 50:1.

Figure 3F:
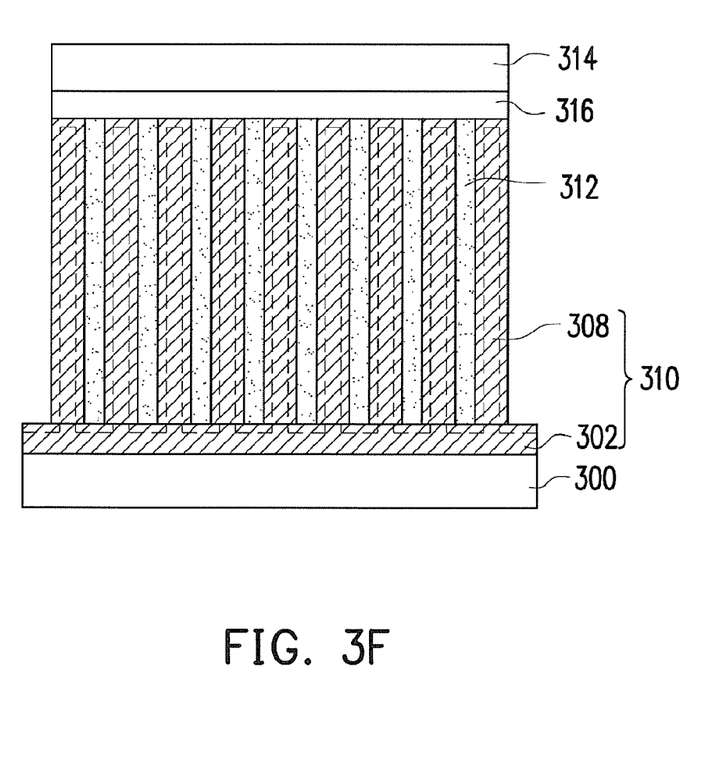

After completing the fabrication of the heterojunction heat conduction buffer layer 310, referring to FIG. 3F, a chip 314 is bonded onto the heterojunction heat conduction buffer layer 310. Before bonding the chip 314 onto the heterojunction heat conduction buffer layer 310, a bonding layer 316 may also be selectively formed on a bonding surface of the chip 314. Methods of forming the bonding layer 316 include electroplating, evaporation, or sputtering. A material of the bonding layer 316 may be the same as or different from a material of the heterojunction heat conduction buffer layer 310. The material of the bonding layer 316 includes tin, copper, gold, silver, or Au—Sn alloy.

Subsequently, the bonding layer 316 of the chip 314 is bonded onto the heterojunction heat conduction buffer layer 310. In one embodiment, a material of the heterojunction heat conduction buffer layer 310 and the bonding layer 316 is tin, for example. Then, a solder reflow equipment, for example, may be used to bond the heterojunction heat conduction buffer layer 310 and the bonding layer 316 at 250° C. through eutectic bonding. In another embodiment, the material of the heterojunction heat conduction buffer layer 310 and the bonding layer 316 is copper, for example. Then, bonding may be done by a sintering process.

The Second Embodiment

FIGS. 4A to 4D are schematic cross-sectional views illustrating a flow of process for fabricating a chip package structure according to a second embodiment of the present invention, wherein same reference numerals refer to same components in the first embodiment.

A difference between the second embodiment and the first embodiment lies in the method of forming the heterojunction heat conduction buffer layer. An illustration on the difference between the second and first embodiments is described below, wherein similarities therebetween are omitted.

Figure 4A:
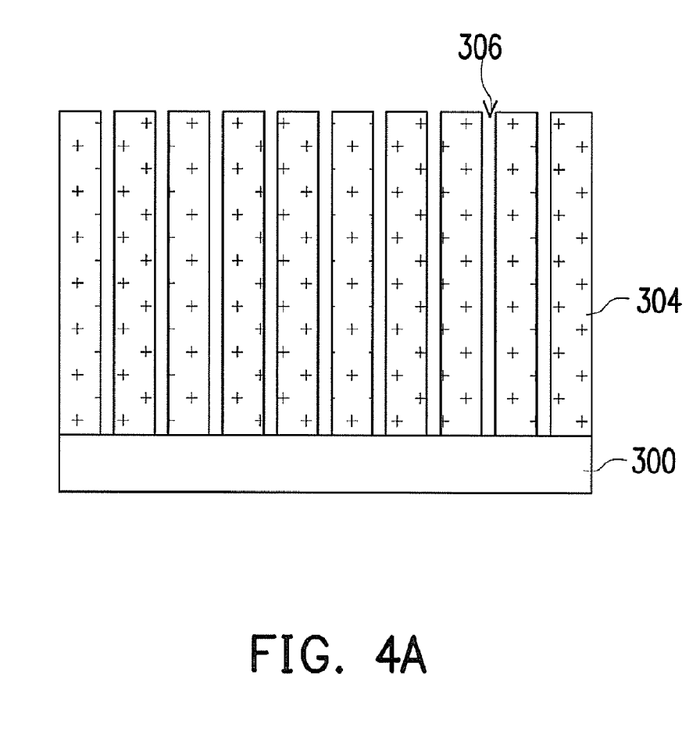
FIGS. 4A to 4D are schematic cross-sectional views illustrating a flow of process for fabricating a chip package structure according to a second embodiment of the present invention.

First, referring to FIG. 4A, a photoresist layer 304 having a plurality of openings 306 is formed on a heat dissipation substrate 300. In this step, when the heat dissipation substrate 300 is a metal core printed circuit board made of copper, for example, a step of forming a metal seed layer (refer to 302 in FIG. 3B) can be omitted and the photoresist layer 304 is directly formed on the heat dissipation substrate 300.

Figure 4B:
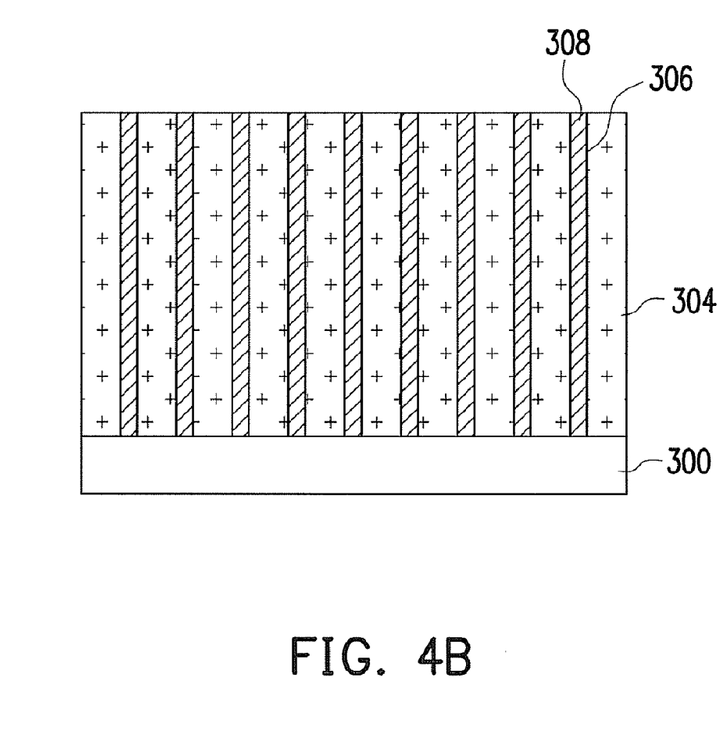

Then, referring to FIG. 4B, a first micro-electroforming process is performed on the heat dissipation substrate 300 to form pillars 308 in the openings 306 of the photoresist layer 304.

Figure 4C:
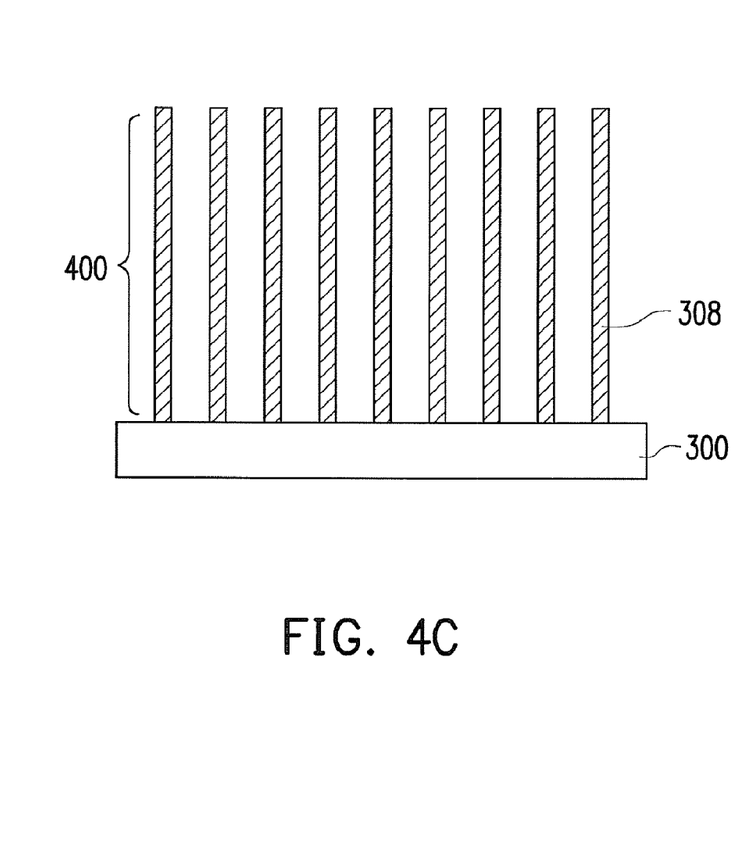

Afterward, referring to FIG. 4C, the photoresist layer 304 is removed to form a heterojunction heat conduction buffer layer 400. In the present embodiment, the heterojunction heat conduction buffer layer 400 merely includes the pillars 308.

Figure 4D:
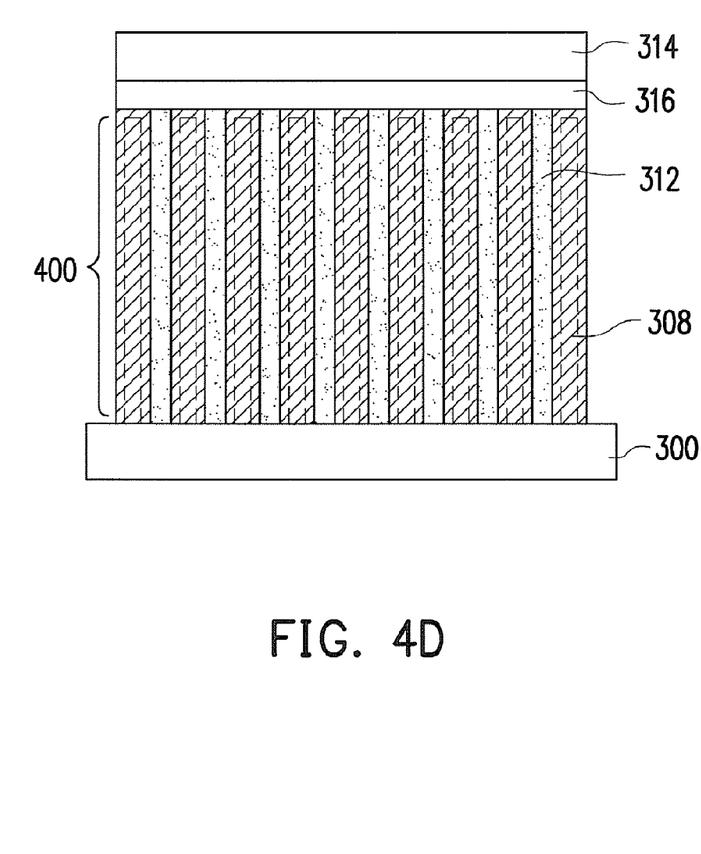

Subsequently, referring to FIG. 4D, a second micro-electroforming process is selectively performed on the heterojunction heat conduction buffer layer 400 to increase width of each pillar 308 of the heterojunction heat conduction buffer layer 400 and thickness of the heat dissipation substrate 300. Next, a bonding layer 316 is formed on a bonding surface of a chip 314, which is then bonded onto the heterojunction heat conduction buffer layer 400.

Third Embodiment

FIGS. 5A to 5D are schematic cross-sectional views illustrating a flow of process for fabricating a chip package structure according to a third embodiment of the present invention, wherein same reference numerals refer to same components in the first embodiment.

A difference between the third embodiment and the first embodiment lies in the method of forming the heterojunction heat conduction buffer layer. An illustration on the difference between the third and first embodiments is described below, wherein similarities therebetween are omitted.

Figure 5A:
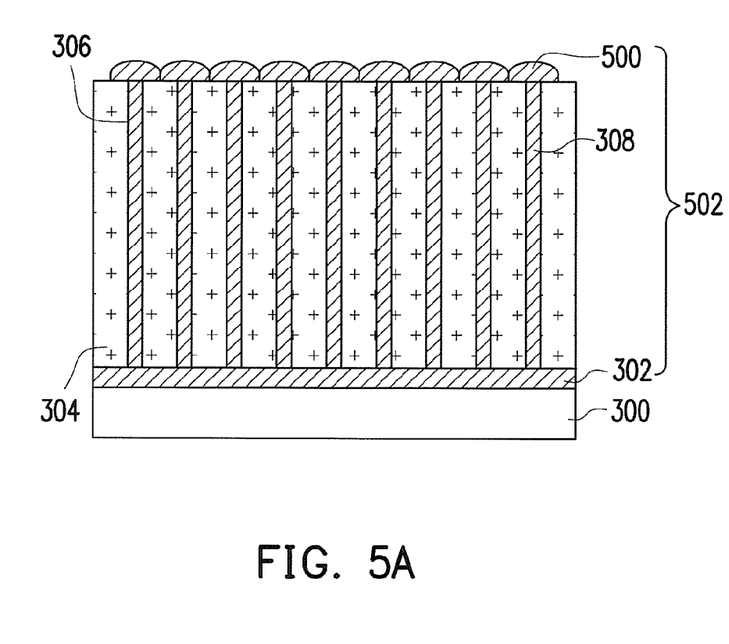
FIGS. 5A to 5D are schematic cross-sectional views illustrating a flow of process for fabricating a chip package structure according to a third embodiment of the present invention.

First, referring to FIG. 5A, a metal seed layer 302 and a photoresist layer 304 are sequentially formed on a heat dissipation substrate 300. Next, a first micro-electroforming process is performed on the metal seed layer 302 to form pillars 308 in openings 306 of the photoresist layer 304. In the third embodiment, the micro-electroforming time is lengthened in this step so that the pillars 308 keep growing toward outside of the openings 306 of the photoresist layer 304 and thereby form a connecting layer 500 on the photoresist layer 304 connecting tops of the pillars 308 to form a heterojunction heat conduction buffer layer 502 including the metal seed layer 302, the pillars 308, and the connecting layer 500. The connecting layer 500 may enable subsequent bonding between the heterojunction heat conduction buffer layer 502 and a chip to be easier. In the present embodiment, the connecting layer 500 is of a mushroom shape. Based on design requirement, a number of openings may be formed in the connecting layer 500 to allow easier removal of the photoresist layer 304 in a later step.

Figure 5B:
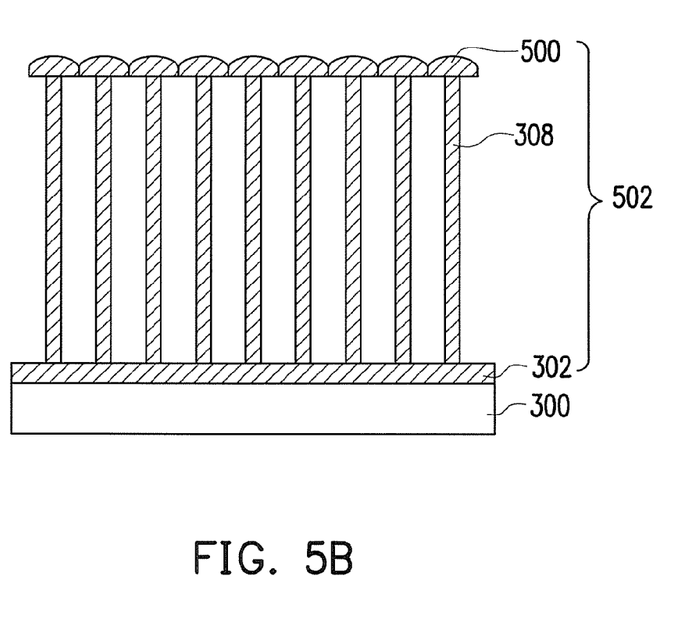

Next, as shown in FIG. 5B, the photoresist layer 304 is removed.

Subsequently, referring to FIG. 5C, a second micro-electroforming process is selectively performed on the heterojunction heat conduction buffer layer 502 to increase width of each pillar 308 of the heterojunction heat conduction buffer layer 502, thickness of the connecting layer 500, and thickness of the metal seed layer 302. Next, a filler 312 may be selectively formed among the pillars 308 of the heterojunction heat conduction buffer layer 502.

Figure 5C:
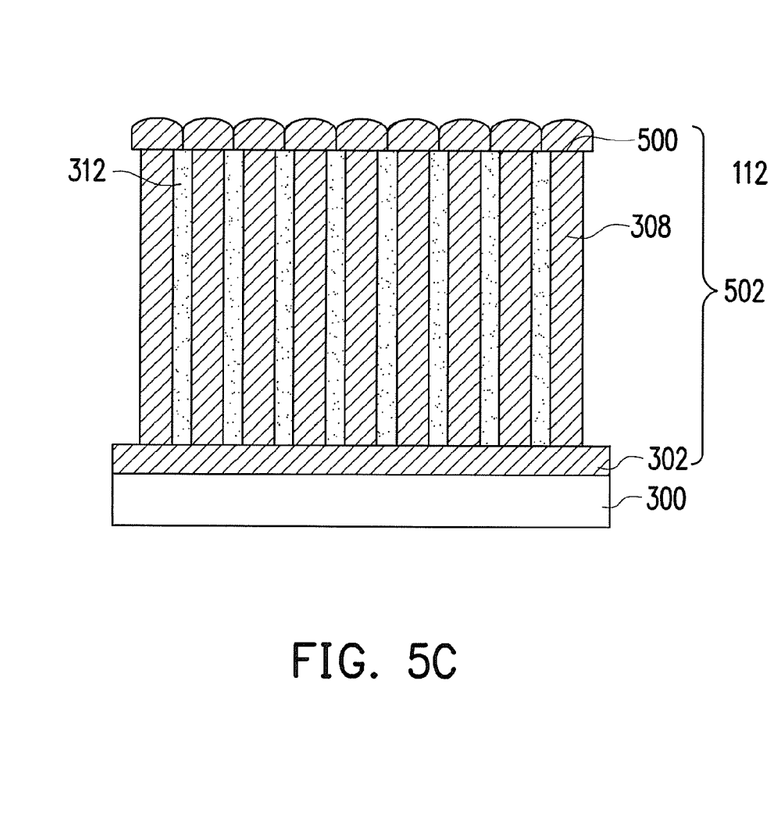
Figure 5D:
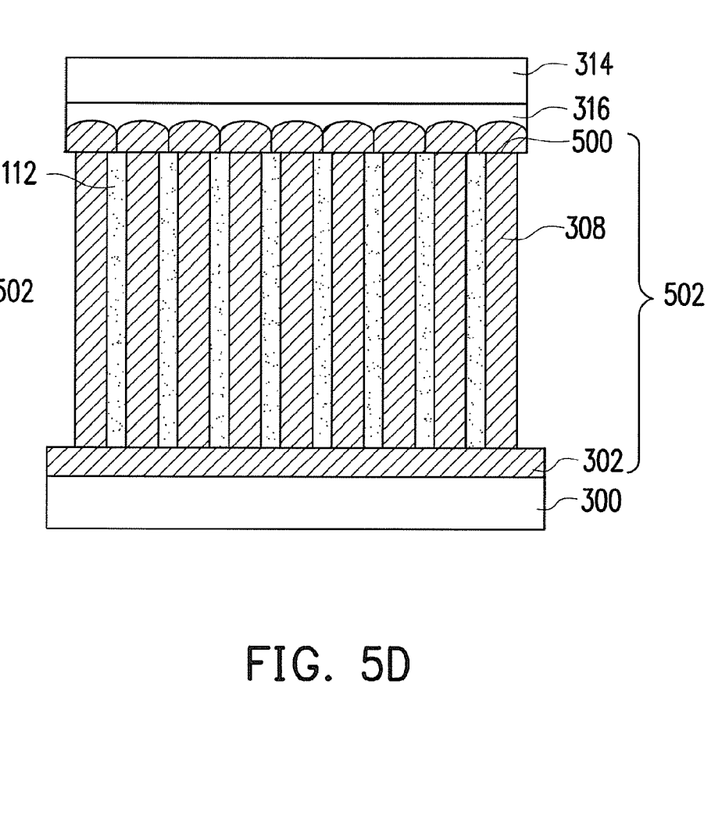

Then, referring to FIG. 5D, a chip 314 is bonded onto the heterojunction heat conduction buffer layer 502. Before bonding the chip 314 onto the heterojunction heat conduction buffer layer 502, a bonding layer 316 may also be selectively formed on a bonding surface of the chip 314. Subsequently, the bonding layer 316 of the chip 314 is bonded onto the connecting layer 500 of the heterojunction heat conduction buffer layer 502.

The Fourth Embodiment

Figure 6:
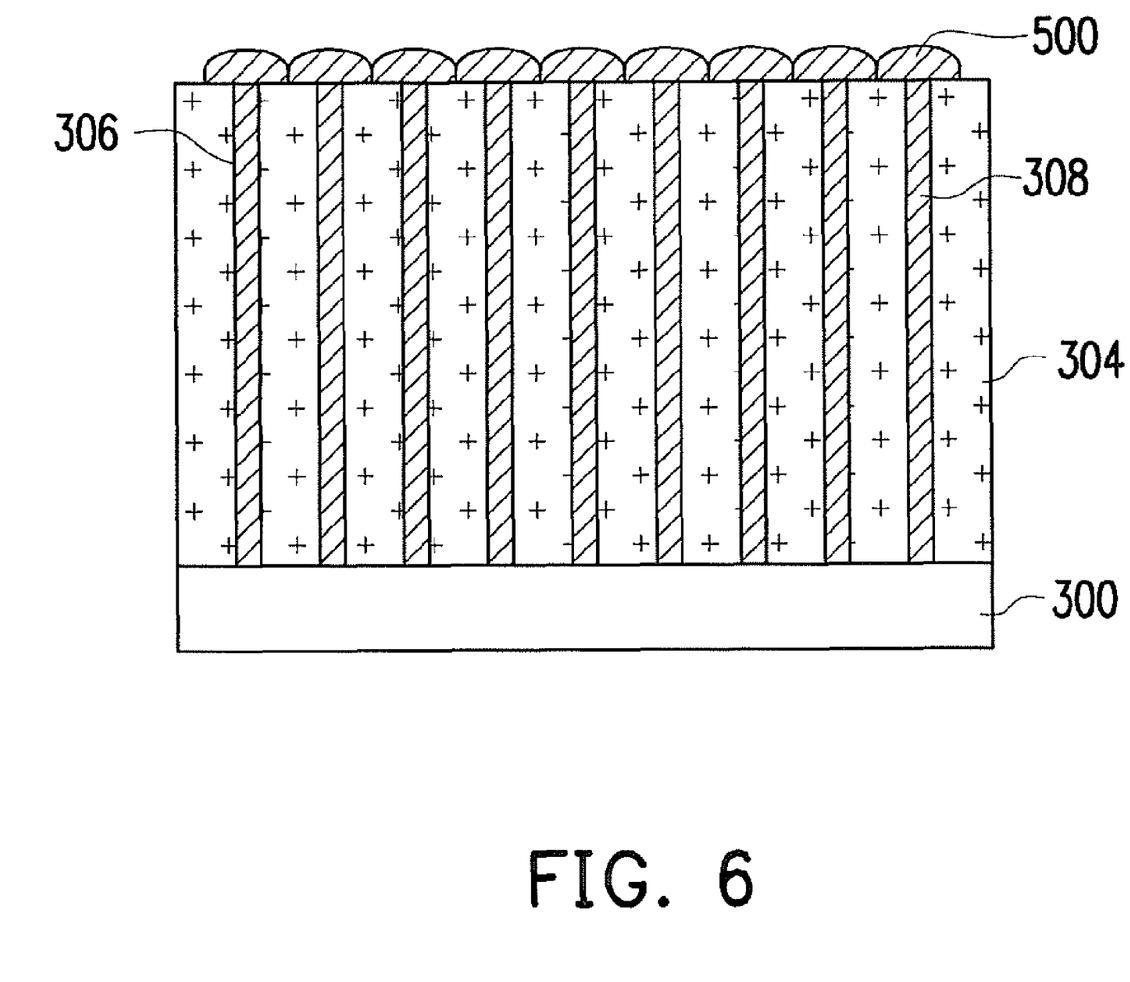
FIG. 6 is schematic cross-sectional view illustrating a flow of process for fabricating a chip package structure according to a fourth embodiment of the present invention.

FIG. 6 is a schematic cross-sectional view illustrating a flow of process for fabricating a chip package structure according to a fourth embodiment of the present invention, wherein same reference numerals refer to same components in the third embodiment.

The fourth embodiment is similar to the second and third embodiments with a difference in the method of forming the heterojunction heat conduction buffer layer. An illustration on the difference between the fourth embodiment and the second and third embodiments is described below, wherein similarities therebetween are omitted.

First, referring to FIG. 6, a photoresist layer 304 is formed on a heat dissipation substrate 300. In this step, when the heat dissipation substrate 300 is a metal core printed circuit board made of copper, for example, a step of forming a metal seed layer can be omitted and the photoresist layer 304 is directly formed on the heat dissipation substrate 300. Next, a first micro-electroforming process is performed on the metal seed layer 300 to form pillars 308 in openings 306 of the photoresist layer 304. In the fourth embodiment, the micro-electroforming time is lengthened in this step so that the pillars 308 keep growing toward outside of the openings 306. Furthermore, a connecting layer 500 is formed on the photoresist layer 304 to connect tops of the pillars 308.

Refer to FIGS. 5B-5D for subsequent steps hereafter, which are not further illustrated herein.

Figure 7:
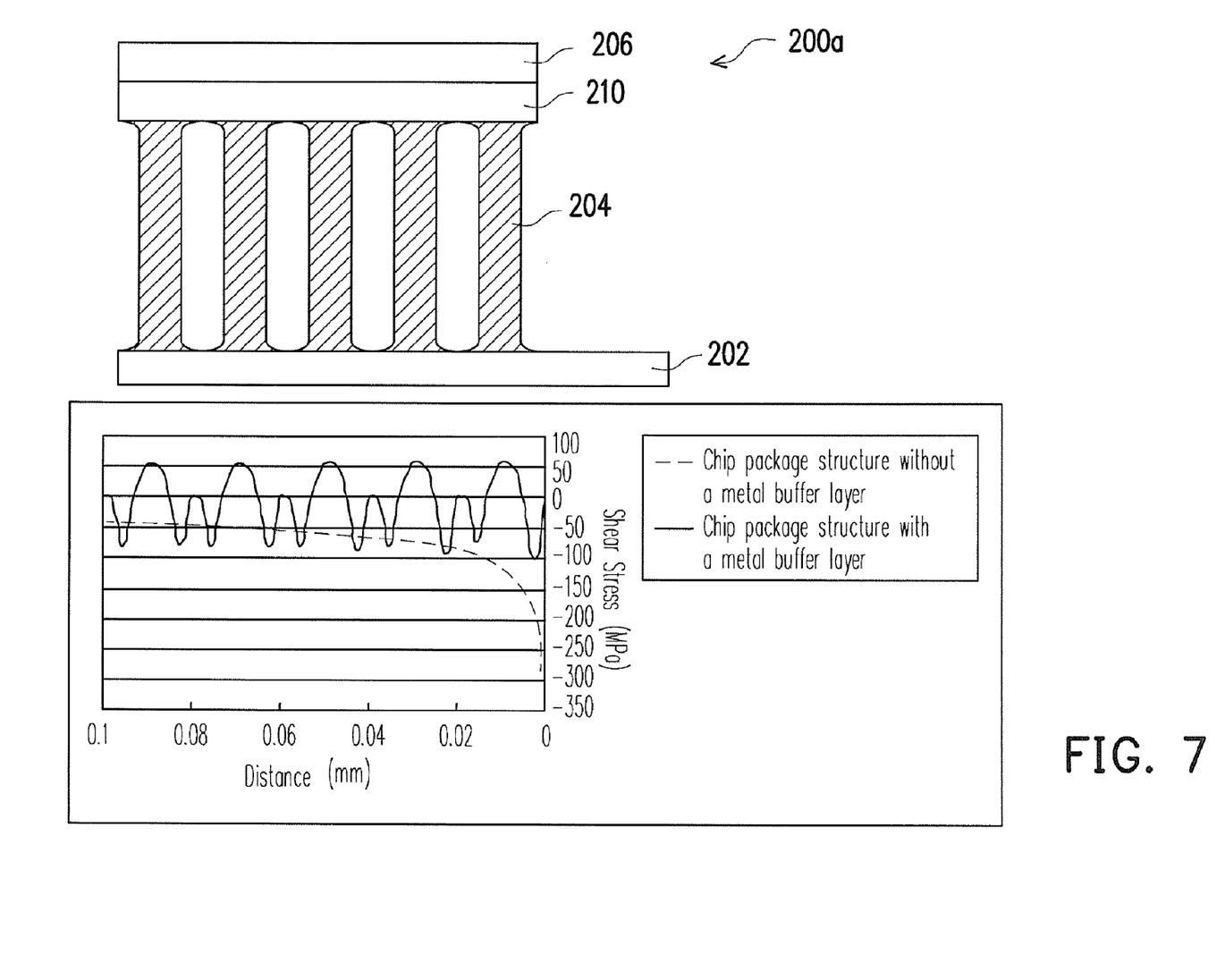
FIG. 7 is a schematic view illustrating a chip of a chip package structure sustaining shear stress when having and not having the heterojunction heat conduction buffer layer of the present invention.
Figure 8:
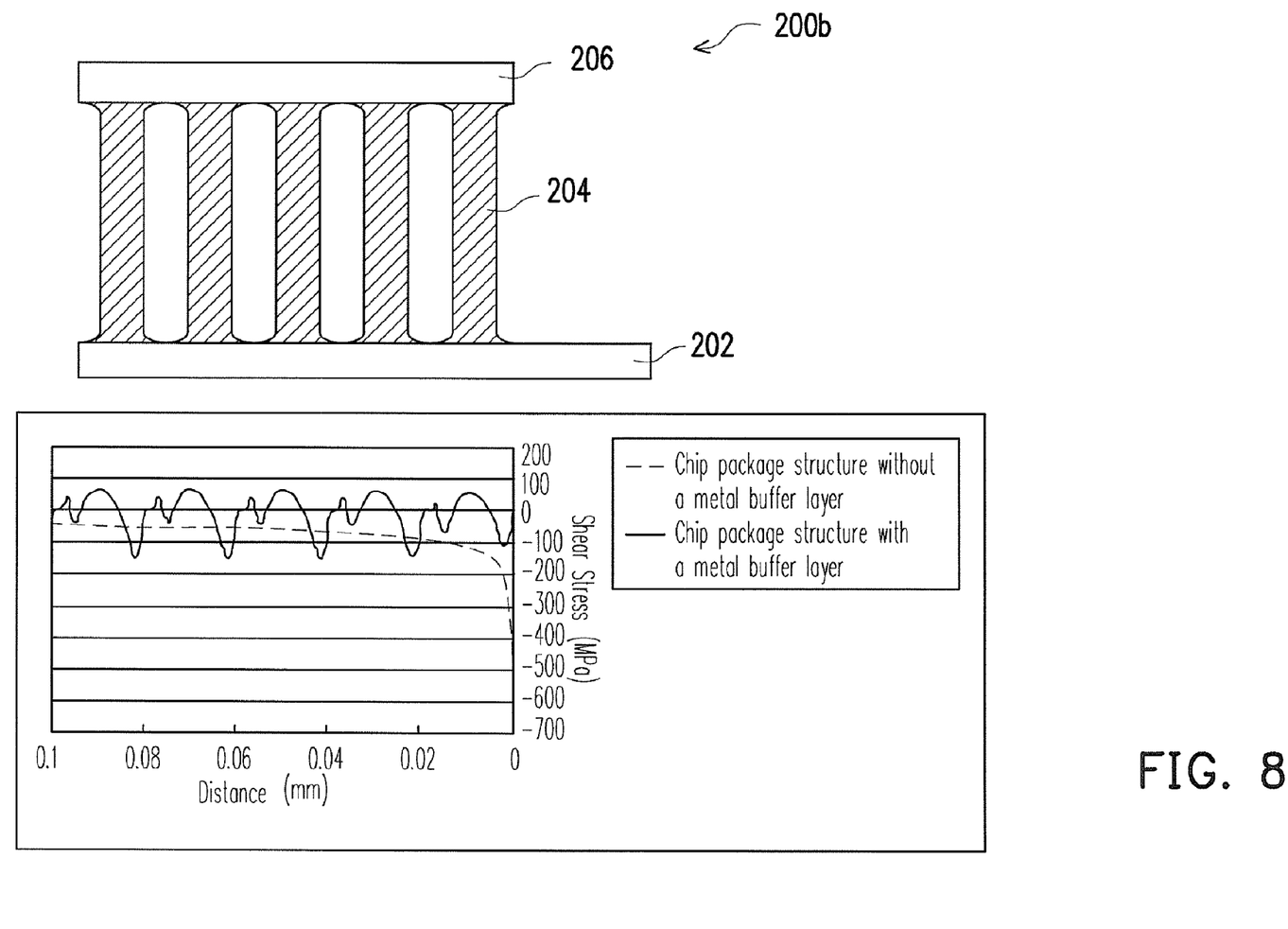
FIG. 8 is a schematic view illustrating a chip of a chip package structure sustaining shear stress when having and not having the heterojunction heat conduction buffer layer of the present invention.

Computer simulations illustrating a chip 206 of chip package structures 200a and 200b sustaining shear stress when having and not having the heterojunction heat conduction buffer layer 204 of the present invention are respectively shown in FIG. 7 and FIG. 8. A material of a heat dissipation substrate 202, the heterojunction heat conduction buffer layer 204, and a bonding layer 210 is copper, for example. A material of the chip 206 is silicon, for example. It should be noted that the chip package structure 200b of FIG. 8 does not have the bonding layer 210.

A horizontal axis of FIGS. 7 and 8 is the distance from the bonding point of the chip package structure 200 to an edge of the chip 206. In general, a bonding point closest to the edge of the chip 206 has a maximum stress and thus may most easily be damaged due to fatigue effect caused by repetitive temperature changes during system operation. In FIGS. 7 and 8, the bonding point of the chip package structure 200 closest to the chip 206 is denoted as the origin. Distance of the bonding point increases from the edge of the chip.

As shown in FIG. 7, without the heterojunction heat conduction buffer layer 204 of the present invention (the dotted line), the shear stress sustained by the bonding point of the heat dissipation substrate 202 closest to the edge of the chip 206 increases rapidly with a maximum of around 300 MPa. However, with the heterojunction heat conduction buffer layer 204 of the present invention (the solid line), the heterojunction heat conduction buffer layer 204 can release the shear stress and evenly distribute onto the entire heterojunction heat conduction buffer layer 204 because of the flexibility effect resulted from the high aspect ratio of the heterojunction heat conduction buffer layer 204. Therefore, the shear stress sustained by the chip 206 basically fluctuates with small variation and does not rapidly increase at points closer to the edge of the chip 206.

Similarly, as shown in FIG. 8, without the heterojunction heat conduction buffer layer 204 of the present invention (the dotted line), the shear stress sustained by the bonding point closest to the edge of the chip 206 increases rapidly with a maximum of around 600 MPa. However, with the heterojunction heat conduction buffer layer 204 of the present invention (the solid line), the heterojunction heat conduction buffer layer 204 can release the shear stress and evenly distribute onto the entire heterojunction heat conduction buffer layer 204 because of the flexibility effect resulted from the high aspect ratio of the heterojunction heat conduction buffer layer 204. Therefore, the shear stress sustained by the chip 206 basically fluctuates with small variation and does not rapidly increase at points closer to the edge of the chip 206.

In summary, in the chip package structure of the present invention, a metal material with high thermal conductivity (e.g. tin or copper) is used to replace heat conducting adhesive or solder bumps in the conventional technology for the heterojunction heat conduction buffer layer. In addition, a high density arrangement is adopted to increase thermal conduction area. Furthermore, because of a high aspect ratio, pillars of the heterojunction heat conduction buffer layer have flexibility, can release shear stress, and thus prevents the system from mechanical fatigue failure and thermal fatigue failure resulted from temperature changes. In addition, a filler such as metallic powder or polymer disposed among the pillars of the heterojunction heat conduction buffer layer can further improve thermal conduction. The chip package structure of the present invention has good heat conduction and can release shear stress for CTE mismatch, and thus is suitable as a heat dissipation solution for an LED package light source of large area and high heat or a concentration solar cell package.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a heat dissipation substrate;
   a chip, disposed on the heat dissipation substrate; and
   a heterojunction heat conduction buffer layer, disposed between the heat dissipation substrate and the chip, wherein the heterojunction heat conduction buffer layer includes a plurality of pillars perpendicular to the heat dissipation substrate and each of the pillars has an aspect ratio between about 3:1 and 50:1.

2. The chip package structure according to claim 1, wherein a material of the heterojunction heat conduction buffer layer comprises tin or copper.

3. The chip package structure according to claim 1, wherein a cross-section of each of the pillars is circular, rectangular, triangular, or diamond.

4. The chip package structure according to claim 1, wherein the pillars of the heterojunction heat conduction buffer layer are arranged in array.

5. The chip package structure according to claim 1, wherein height of the heterojunction heat conduction buffer layer is 1/5-1/10 of length or width of the heterojunction heat conduction buffer layer.

6. The chip package structure according to claim 1, wherein the heterojunction heat conduction buffer layer further comprises a connecting layer connecting tops of the pillars.

7. The chip package structure according to claim 1, further comprising a bonding layer disposed between the chip and the heterojunction heat conduction buffer layer.

8. The chip package structure according to claim 7, wherein a material of the bonding layer is the same as a material of the heterojunction heat conduction buffer layer.

9. The chip package structure according to claim 7, wherein a material of the bonding layer is different from a material of the heterojunction heat conduction buffer layer.

10. The chip package structure according to claim 7, wherein a material of the bonding layer comprises tin (Sn), copper, gold (Au), silver, or Au—Sn alloy.

11. The chip package structure according to claim 1, further comprising a filler disposed among the pillars of the heterojunction heat conduction buffer layer.

12. The chip package structure according to claim 11, wherein a material of the filler comprises metallic powder or polymer.

13. The chip package structure according to claim 1, wherein the chip comprises a solar cell chip or a light emitting diode chip.

* * * * *